(12) United States Patent
Shan

(10) Patent No.: US 11,355,523 B2
(45) Date of Patent: Jun. 7, 2022

(54) ARRAY SUBSTRATE, DISPLAY PANEL, AND DISPLAY DEVICE

(71) Applicant: HKC Corporation Limited, Guangdong (CN)

(72) Inventor: Jianfeng Shan, Guangdong (CN)

(73) Assignee: HKC Corporation Limited, Guangdong (CN)

( * ) Notice: Subject to any disclaimer, the term of this patent is extended or adjusted under 35 U.S.C. 154(b) by 0 days.

(21) Appl. No.: 17/042,312

(22) PCT Filed: Nov. 15, 2018

(86) PCT No.: PCT/CN2018/115699
§ 371 (c)(1),
(2) Date: Sep. 28, 2020

(87) PCT Pub. No.: WO2020/082461
PCT Pub. Date: Apr. 30, 2020

(65) Prior Publication Data
US 2021/0043659 A1    Feb. 11, 2021

(30) Foreign Application Priority Data
Oct. 22, 2018  (CN) .......................... 201811230980.9

(51) Int. Cl.
*H01L 29/04*  (2006.01)
*H01L 27/12*  (2006.01)
(Continued)

(52) U.S. Cl.
CPC ............ *H01L 27/124* (2013.01); *H01L 24/05* (2013.01); *H01L 24/06* (2013.01); *H01L 24/08* (2013.01);
(Continued)

(58) Field of Classification Search
None
See application file for complete search history.

(56) References Cited

U.S. PATENT DOCUMENTS 8,803,839 B2    8/2014  Brosnan et al.
9,679,862 B2 *  6/2017  Lin ................... H01L 23/49827
(Continued)

FOREIGN PATENT DOCUMENTS

CN    101510383 A    8/2009
CN    105529338 A    4/2016
(Continued)

OTHER PUBLICATIONS

International Search Report for Application No. PCT/CN2018/115699 dated Apr. 11, 2019, 2 pages.

*Primary Examiner* — Hung K Vu
(74) *Attorney, Agent, or Firm* — Seyfarth Shaw LLP

(57) ABSTRACT

An array substrate (100, 200, 300) comprises a display region (110) and a bonding region (130, 230, 330). The bonding region (130, 230, 330) is disposed around the display region (110). The bonding region (130, 230, 330) of the array substrate (100, 200, 300) is provided with at least one pad (150, 250). The at least one pad (150, 250) comprises a plurality of first gold fingers (151, 251, 351) spaced apart and arranged in parallel. Intervals between adjacent first golden fingers (151, 251, 351) in the same pad (150, 250) are not entirely the same.

12 Claims, 2 Drawing Sheets

(51) Int. Cl.
*H01L 23/00* (2006.01)
*H01L 25/18* (2006.01)

(52) U.S. Cl.
CPC .............. *H01L 24/32* (2013.01); *H01L 25/18* (2013.01); *H01L 2224/05644* (2013.01); *H01L 2224/06165* (2013.01); *H01L 2224/08225* (2013.01); *H01L 2224/32227* (2013.01)

(56) References Cited

U.S. PATENT DOCUMENTS

| | | | |
|---|---|---|---|
| 9,839,122 B2* | 12/2017 | Cao | H05K 1/117 |
| 2009/0147204 A1* | 6/2009 | Kang | G02F 1/13452 |
| | | | 349/150 |
| 2016/0104692 A1* | 4/2016 | Lee | G02F 1/13452 |
| | | | 257/773 |
| 2017/0221845 A1 | 8/2017 | Chen et al. | |

FOREIGN PATENT DOCUMENTS

| | | |
|---|---|---|
| CN | 105529339 A | 4/2016 |
| CN | 205912332 U | 1/2017 |
| CN | 206620358 U | 11/2017 |
| CN | 104540315 B | 1/2018 |
| CN | 107703664 A | 2/2018 |
| CN | 107749239 A | 3/2018 |
| CN | 108391373 A | 8/2018 |
| CN | 108668426 A | 10/2018 |

\* cited by examiner

ARRAY SUBSTRATE, DISPLAY PANEL, AND DISPLAY DEVICE

CROSS REFERENCE TO RELATED APPLICATIONS

This application is a U.S. National Stage application of, and claims priority to, PCT/CN2018/115699, filed Nov. 15, 2018, which further claims priority to Chinese Patent Application No. 2018112309809, filed Oct. 22, 2018, the entire contents of which are incorporated herein in their entirety.

TECHNICAL FIELD

The present disclosure relates to the field of display, and in particular to an array substrate, a display panel and a display device.

BACKGROUND

Traditionally, a display panel includes an array substrate which includes a display area and a bonding area arranged around the display area. A driver integrated circuit chip is bound to the bonding area of the array substrate. Chip on film (COF) is commonly used for the bonding of the driver integrated circuit chip and the array substrate, due to the low cost of the COF.

With the development of technology, display devices containing curved-surface display panels become more and more popular. However, after the bending of the bonding area of the array substrate, the display panel is prone to instability.

SUMMARY

According to various embodiments of the present disclosure, an array substrate, a display panel and a display device are provided.

According to one aspect of the present disclosure, an array substrate is provided, including:

a display area; and a bonding area surrounding the display area, wherein the bonding area of the array substrate is provided with at least one pad, the pad comprises a plurality of spaced first golden fingers arranged in parallel at intervals, and in the same pad, the intervals between adjacent first golden fingers are not exactly identical.

In one embodiment of the present disclosure, after the bonding area is bent, the pad is positioned on a concave side of the bonding area; in the same pad, the larger the curvature of the bonding area is after being bent, the larger the intervals between the adjacent first golden fingers is; and in the same pad, the smaller the curvature of the bonding area is after being bent, the smaller the intervals between the adjacent first golden fingers is.

In one embodiment, the array substrate further comprises a driver integrated circuit chip disposed in the bonding area of the array substrate and bonded with the bonding area via a chip on film; and a plurality of spaced second golden fingers arranged in parallel at intervals are disposed on one side of the chip on film away from the driver integrated circuit chip, wherein the second golden fingers are disposed on the chip on film, and the plurality of first golden fingers are electrically connected to the plurality of second golden fingers, respectively.

In one embodiment, after the bonding area is bent, the pad is positioned on a convex side of the bonding area; in the same pad, the larger the curvature of the bonding area is after being bent, the smaller the intervals between the adjacent first golden fingers is; and in the same pad, the smaller the curvature of the bonding area is after being bent, the larger the intervals between the adjacent first golden fingers is.

In one embodiment, each of the first golden fingers has a surface that is configured to be electrically connected to the second golden finger on the chip on film, and the surface is provided with a groove.

In one embodiment, the groove extends along a fold line.

In one embodiment, the groove extends along a curve.

In one embodiment, the bonding area surrounds two adjacent sides of the display area.

In one embodiment, the array substrate further comprises a driver integrated circuit chip disposed in the bonding area and bonded with the bonding area via a chip on film; and a plurality of spaced second golden fingers arranged in parallel at intervals are disposed on one side of the chip on film away from the driver integrated circuit chip, wherein the second golden fingers are disposed on the chip on film, and the plurality of first golden fingers are electrically connected to the plurality of second golden fingers, respectively.

In one embodiment, the cross-sectional area of the first golden finger taken along a direction perpendicular to the thickness of the array substrate is greater than that of the second golden finger taken along the direction perpendicular to the thickness of the array substrate.

In one embodiment, the first golden finger adheres to the second golden finger via an anisotropic conductive film.

In one embodiment, the array substrate is a thin film transistor array substrate.

According to the other aspect of the present disclosure, a display panel is provided, including an array substrate and a color film substrate aligned with the array substrate.

The array substrate comprises:

a display area; and a bonding area surrounding the display area, wherein the bonding area of the array substrate is provided with at least one pad, the pad comprises a plurality of spaced first golden fingers arranged in parallel at intervals, and in the same pad, the intervals between adjacent first golden fingers are not exactly identical.

In one embodiment, after the bonding area is bent, the pad is positioned on a concave side of the bonding area; in the same pad, the larger the curvature of the bonding area is after being bent, the larger the intervals between the adjacent first golden fingers is; and in the same pad, the smaller the curvature of the bonding area is after being bent, the smaller the intervals between the adjacent first golden fingers is.

In one embodiment, after the bonding area is bent, the pad is positioned on a convex side of the bonding area; in the same pad, the larger the curvature of the bonding area is after being bent, the smaller the intervals between the adjacent first golden fingers is; and in the same pad, the smaller the curvature of the bonding area is after being bent, the larger the intervals between the adjacent first golden fingers is.

According to another aspect of the present disclosure, a display device is provided, including a display panel; wherein the display panel comprises an array substrate and a color film substrate aligned with the array substrate.

The array substrate comprises:

a display area; and a bonding area surrounding the display area, wherein the bonding area of the array substrate is provided with at least one pad, the pad comprises a plurality of spaced first golden fingers arranged in parallel at intervals, and in the same pad, the intervals between adjacent first golden fingers are not exactly identical.

In one embodiment, after the bonding area is bent, the pad is positioned on a concave side of the bonding area; in the same pad, the larger the curvature of the bonding area is after being bent, the larger the intervals between the adjacent first golden fingers is; and in the same pad, the smaller the curvature of the bonding area is after being bent, the smaller the intervals between the adjacent first golden fingers is.

In one embodiment, after the bonding area is bent, the pad is positioned on a convex side of the bonding area; in the same pad, the larger the curvature of the bonding area is after being bent, the smaller the intervals between the adjacent first golden fingers is; and in the same pad, the smaller the curvature of the bonding area is after being bent, the larger the intervals between the adjacent first golden fingers is.

Details of one or more embodiments of the present disclosure are according to the following accompanying drawings and descriptions. Other features, objectives, and advantages of the present disclosure will become apparent from the specification, the accompanying drawings, and the claims.

BRIEF DESCRIPTION OF THE DRAWINGS

To better describe and illustrate embodiments or examples of the inventions disclosed herein, reference may be made to one or more drawings. The additional details or examples used to describe the drawings are not to be construed as limiting the scope of any of the disclosed inventions, the presently described embodiments or examples, and the best mode of the inventions.

DETAILED DESCRIPTION OF THE EMBODIMENTS

Figure 1:
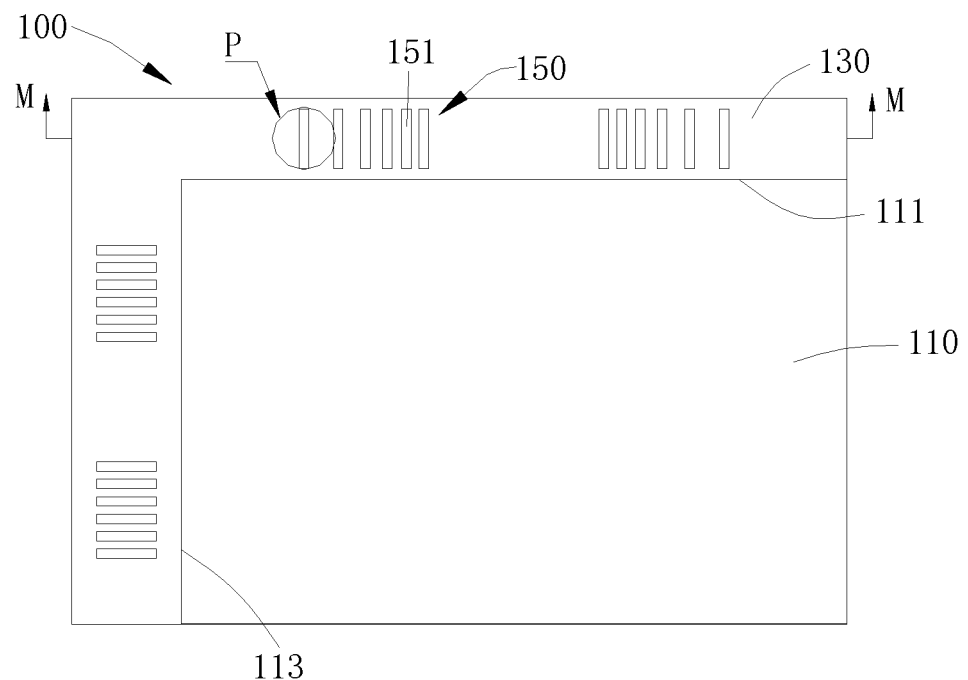
FIG. 1 is a schematic diagram of an array substrate according to one embodiments of the present disclosure.

The driver integrated circuit chip is bonded with the bonding area of the array substrate. Specifically, the bonding area is provided with a pad, the pad includes a plurality of spaced first golden fingers, and the chip on film is also provided with a plurality of spaced second golden fingers. The first golden fingers on the pad is adhered to the second golden fingers on the chip on film via an anisotropic conductive film (ACF).

The inventor has found that after the bonding area is bent, the intervals between adjacent first golden fingers positioned on the bonding area has a trend of increasing or decreasing. While on the corresponding chip on film, the intervals between the adjacent second golden fingers varies in the opposite direction. Therefore, after the bonding area is bent, the first golden fingers and the second golden fingers have a tendency of dislocation, which may lead to the dislocation of the first golden fingers and the second golden fingers, thereby leading to poor contact between the golden fingers on the array substrate with the golden fingers on the chip on film, and abnormal displaying of the display panel.

In view of the above problems, the present disclosure provides an array substrate including a display area and a bonding area surrounding the display area; wherein the bonding area of the array substrate is provided with at least one pad, the pad comprises a plurality of spaced first golden fingers arranged in parallel at intervals, and in the same pad, the intervals between adjacent first golden fingers are not exactly identical.

In the same pad, the intervals between the adjacent first golden fingers is not exactly identical, so that the first golden fingers on the bonding area can match with the second golden fingers on the chip on film after the bonding area is bent, thus avoiding the tendency of dislocation of the first golden fingers and the second golden fingers to ensure the good contact of the chip on film and the signals of the array substrate, namely effectively avoiding the abnormal displaying of the display panel.

To make the objectives, technical solutions, and advantages of the present disclosure clearer and more comprehensible, the following further describes the present disclosure in detail with reference to the accompanying drawings and embodiments. It should be understood that the specific embodiments described herein are merely used to explain the present disclosure but are not intended to limit the present disclosure.

Unless otherwise defined, all technical and scientific terms used herein have the same meaning as commonly understood by persons skilled in the art to which the present disclosure pertains. The terminology used in the description of the present disclosure herein is for describing particular embodiments only and is not intended to be limiting of the present disclosure. Technical features of the foregoing embodiments may be randomly combined. For the brevity of description, not all possible combinations of the technical features in the foregoing embodiments are described. However, as long as combinations of these technical features do not contradict each other, it should be considered that the combinations all fall within the scope of this specification.

As shown in FIG. 1 to FIG. 4, one embodiment of the present disclosure provides an array substrate 100, including a display area 110, and a bonding area 130 disposed around the display area 110. The bonding area 130 of the array substrate 100 is provided with four pads 150.

Specifically, each of the pads 150 includes a plurality of spaced first golden fingers 151 arranged in parallel at intervals. In the same pad 150, the intervals between adjacent first golden fingers 151 are not exactly identical.

It should be noted that, in the present disclosure, the intervals between the adjacent first golden fingers 151 refer to the intervals when the bonding area 130 is not bent.

In the same pad 150, the intervals between the adjacent first golden fingers are not exactly identical, so that the first golden fingers 151 on the bonding area 130 can match with the second golden fingers on the chip on film after the bonding area 130 is bent, so as to ensure the good contact of the chip on film and the signals of the array substrate 100, namely effectively avoiding the abnormal displaying of the display panel.

Figure 3:
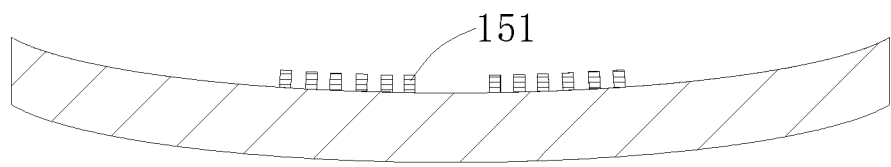
FIG. 3 is a cross-sectional view of the array substrate of FIG. 2 after being bent.

In this embodiment, after the bonding area 130 is bent, the pad 150 is positioned on a concave side of the bonding area 130, as shown in FIG. 3. In the same pad 150, the larger the curvature of the bonding area 130 after being bent, and the larger the intervals between the adjacent first golden fingers 151. In the same pad 150, the smaller the curvature of the bonding area 130 after being bent, the smaller the intervals between the adjacent first golden fingers 151.

Figure 2:
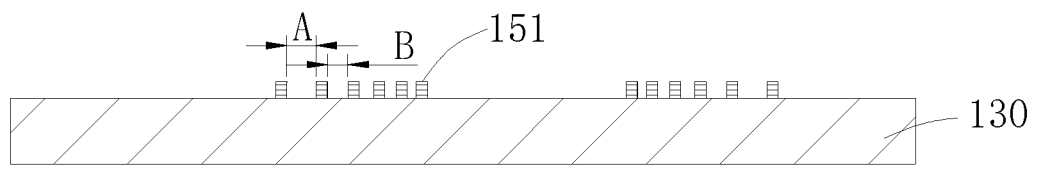
FIG. 2 is a cross-sectional view of the array substrate shown in FIG. 1 along line M-M.

Specifically, in this embodiment, as shown in FIG. 2 and FIG. 3, taking the left-side pad 150 as an example, the curvature of the corresponding portion of the bonding area 130 to the left pad 150 gradually decreases from left to right after the bonding area 130 is bent. The interval between the left-side first first golden finger 151 and the second first golden finger 151 is set as A, the interval between the left-side second first golden finger 151 and the third first golden finger 151 is set as B, A>B, and so on.

More specifically, when the bonding area 130 is bent, the intervals between two adjacent first golden fingers 151 decreases in the same pad 150. In this embodiment, the intervals between two adjacent first golden fingers 151 is increased, so that the intervals between two adjacent first golden fingers 151 is matched with the second golden fingers on the chip on film.

Of course, in other embodiments, if the curvature of the bonding area corresponding to some or all of the regions of the pad is identical, the intervals between the adjacent first golden fingers 151 of the corresponding regions of the pad are identical. For example, in this embodiment, if the bonding area 130 positioned on the periphery of the second side 113 of the display area 110 is not bent, the intervals between the adjacent first golden fingers 151 is identical in the uniform pad 150 located in the area.

Figure 4:
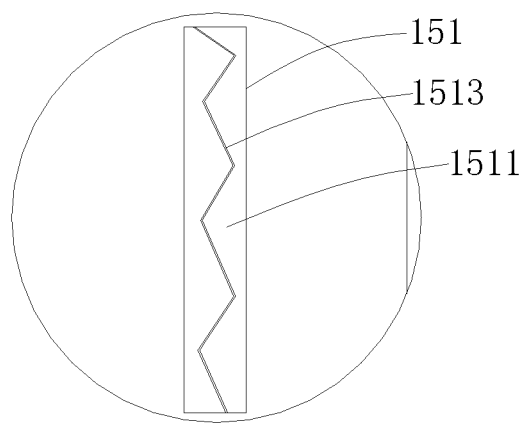
FIG. 4 is a partially enlarged view of P in FIG. 1.

Referring to FIG. 4 for details, in this embodiment, each of the first golden fingers 151 has a surface 1511 that is configured to be electrically connected and fixed to a second golden finger on the chip on film, and the surface 1511 is provided with a groove 1513. Specifically, the first golden fingers 151 is adhered to the second golden fingers on the chip on film via an anisotropic conductive film (ACF). In the bonding process between the chip on film and the array substrate 100, the arrangement of the groove 1513 can eliminate the air between AFC and the first golden fingers 151, thereby reducing the air bubbles generated during the bonding process between the chip on film and the array substrate 100, improving the adhesion between the first golden fingers 151 and the ACF, and effectively avoiding the dislocation between the first golden fingers 151 and the second golden fingers.

In addition, in this embodiment, the arrangement of the groove 1513 can effectively reduce the bending stress on the first golden fingers 151, thereby effectively preventing the intervals of the adjacent first golden fingers 151 from decreasing to much caused by the bending of the bonding area 130.

In this embodiment, as shown in FIG. 4, the groove 1513 extends along a fold line to increase the total length of the groove 1513, so as to better improve the adhesion between the first golden fingers 151 and the ACF. Of course, in other embodiments, the groove is not limited to extending along a fold line, but may also extend along a curve, a combination of a fold line and a curve, etc.

In addition, in this embodiment, only one groove 1513 is disposed on the surface 1511. It should be appreciated that in other embodiments, a plurality of grooves can be disposed on the corresponding surface, to better improve the adhesion between the first golden fingers and the ACF.

Optionally, the cross-section of the groove 1513 is of a regular or irregular shape, such as a triangle, rectangle or trapezoid shape.

In this embodiment, the bonding area 130 is disposed surrounding two adjacent sides of the display area 110. Specifically, the bonding area 130 is disposed surrounding the first side 111 and the second side 113 of the display area 110. Of course, in other embodiments, the bonding area may also be disposed surrounding any one or any two or more than two sides of the display area 110.

In this embodiment, the array substrate 100 is a thin film transistor array substrate. Of course, in other embodiments, the array substrate may be another type of array substrate.

Figure 5:
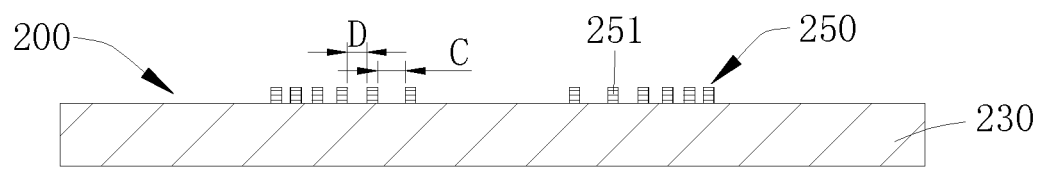
FIG. 5 is a cross-sectional view of the array substrate according to another embodiment of the present disclosure.
Figure 6:
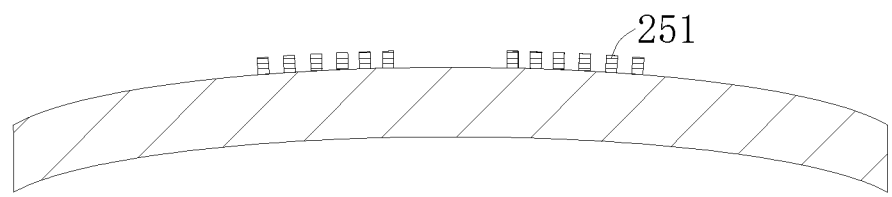
FIG. 6 is a cross-sectional view of the array substrate of FIG. 5 after being bent.

As shown in FIG. 5 and FIG. 6, another embodiment of the present disclosure provides an array substrate 200, which differs from the array substrate 100 in that, the pad 250 is positioned on a convex side of the bonding area 230 after the bonding area 230 is bent. Specifically, in the same pad 250, the larger the curvature of the bonding area 230 after being bent, the smaller the intervals between the adjacent first golden fingers 251. In the same pad 250, the smaller the curvature of the bonding area 230 after being bent, the larger the intervals between the adjacent first golden fingers 251.

Specifically, in this embodiment, taking the left-side pad 250 as an example, the curvature of the corresponding portion of the bonding area 230 to the left-side pad 250 gradually decreases from left to right after the bonding area 230 is bent. The interval between the right-side first first golden finger 251 and the second first golden finger 251 is set as C, the interval between the right-side second first golden finger 251 and the third first golden finger 251 is set as D, C>D, and so on.

More specifically, when the bonding area 230 is bent, the intervals between two adjacent first golden fingers 251 increases in the same pad 250. In this embodiment, the intervals between two adjacent first golden fingers 251 is decreased, so that the intervals between two adjacent first golden fingers 251 is matched with the second golden fingers on the chip on film.

It should be noted that, the bonding area 130 of the array substrate 100 and the bonding area of the array substrate 200 are bent only in one direction. In other embodiments, the bonding area of the array substrate may also be bent in multiple directions, that is, the bonding area of the array substrate may also have other regular or irregular shapes such as a wave shape. Accordingly, the intervals between adjacent first golden fingers in each pad is set according to the bending direction and the curvature of the bonding area on the corresponding area.

Figure 7:
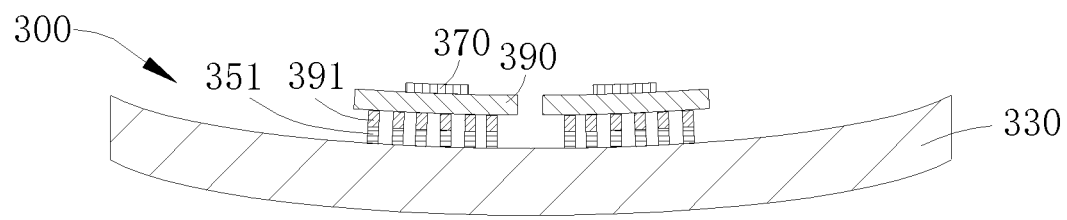
FIG. 7 is a cross-sectional view of the array substrate according to still another embodiment of the present disclosure after being bent.

As shown in FIG. 7, another embodiment of the present disclosure provides an array substrate 300. Unlike the array substrate 100, the array substrate 300 further includes a driver integrated circuit chip 370 disposed in a bonding area 330. The driver integrated circuit chip 370 is bonded with the bonding area 330 through a chip on film 390. The one side of the chip on film 390 far away from the driver integrated circuit chip 370 is provided with a plurality of parallelly spaced second golden fingers 391, and the second golden fingers 391 are uniformly disposed on the chip on film 390. The plurality of first golden fingers 351 is electrically connected to the plurality of second golden fingers 391, respectively.

In one feasible embodiment, the cross-sectional area of the first golden finger taken along a direction perpendicular to the thickness of the array substrate is greater than that of the second golden finger taken along the direction perpendicular to the thickness of the array substrate. Therefore, the contact area of first golden fingers and the second golden fingers can be ensured even if the first golden fingers and the second golden fingers are slightly misaligned, thereby ensuring that the chip on film is in good contact with the signals of the array substrate, and effectively avoiding the abnormal displaying of the display panel.

One embodiment of the present invention further provides a display panel, including an array substrate and a color film substrate aligned with the array substrate. The array substrate includes a display area and a bonding area disposed around the display area. The bonding area of the array substrate is provided with at least one pad including a plurality of parallelly spaced first golden fingers. In the same pad, the intervals between the adjacent first golden fingers are not exactly identical.

According to the above-mentioned display panel, in the same pad, the intervals between the adjacent first golden fingers are not exactly identical, so that the first golden fingers on the bonding area can match with the second golden fingers on the chip on film after the bonding area is bent, in order to ensure the contact area of the first golden fingers and the second golden fingers, thereby ensuring the good contact of the chip on film and the signals of the array substrate, namely effectively avoiding the abnormal displaying of the display panel.

It will be appreciated that the array substrate of the display panel described above may be the array substrate provided for any of the embodiments of the present application.

One embodiment of the present invention further provides a display device, including a display panel. The display panel includes an array substrate and a color film substrate aligned with the array substrate. The array substrate includes a display area and a bonding area disposed around the display area. The bonding area of the array substrate is provided with at least one pad including a plurality of parallelly spaced first golden fingers. In the same pad, the intervals between the adjacent first golden fingers are not exactly identical.

According to the above-mentioned display device, in the same pad, the intervals between the adjacent first golden fingers are not exactly identical, so that the first golden fingers on the bonding area are matched with the second golden fingers on the chip on film after the bonding area is bent, in order to ensure the contact area of the first golden fingers and the second golden fingers, thereby ensuring the good contact of the chip on film and the signals of the array substrate, namely effectively avoiding the abnormal displaying of the display panel.

It will be appreciated that the display panel of the display device described above may be the display panel provided for any of the embodiments of the present application.

Technical features in the foregoing embodiments may be combined randomly. For the brevity of description, not all possible combinations of various technical features in the foregoing embodiments are described. However, as long as combinations of these technical features do not contradict each other, it should be considered that the combinations all fall within the scope of this specification.

The foregoing embodiments only describe several implementations of the present disclosure, which are described specifically and in detail, and therefore cannot be construed as a limitation to the patent scope of the present disclosure. It should be noted that, a person of ordinary skill in the art may make various changes and improvements without departing from the ideas of the present disclosure, which shall all fall within the protection scope of the present disclosure. Therefore, the protection scope of the present disclosure shall be subject to the appended claims.

What is claimed is:

1. An array substrate, comprising:
    a display area; and
    a bonding area surrounding the display area, wherein the bonding area of the array substrate is provided with at least one pad, the pad comprises a plurality of spaced first golden fingers arranged in parallel at intervals, and in the same pad, the intervals between adjacent first golden fingers are not exactly identical, and
    wherein a curvature of a portion of the bonding area corresponding to the pad gradually decreases from left to right, when the pad is positioned on a concave side of the bonding area.

2. The array substrate according to claim 1, wherein after the bonding area is bent, the pad is positioned on the concave side of the bonding area, in the same pad, the larger the curvature of the bonding area after being bent, the larger the intervals between the adjacent first golden fingers, and in the same pad, the smaller the curvature of the bonding area after being bent, the smaller the intervals between the adjacent first golden fingers.

3. The array substrate according to claim 2, wherein the array substrate further comprises a driver integrated circuit chip disposed in the bonding area of the array substrate and bonded with the bonding area via a chip on film, a plurality of spaced second golden fingers arranged in parallel at intervals are disposed on one side of the chip on film away from the driver integrated circuit chip, wherein the second golden fingers are uniformly disposed on the chip on film, and the plurality of first golden fingers are electrically connected to the plurality of second golden fingers, respectively.

4. The array substrate according to claim 1, wherein after the bonding area is bent, the pad is positioned on a convex side of the bonding area, in the same pad, the larger the curvature of the bonding area is after being bent, the smaller the intervals between the adjacent first golden fingers, and in the same pad, the smaller the curvature of the bonding area is after being bent, the larger the intervals between the adjacent first golden fingers.

5. The array substrate according to claim 1, wherein each of the first golden fingers has a surface configured to be electrically connected to a second golden finger on a chip on film, and the surface is provided with a groove.

6. The array substrate according to claim 5, wherein the groove extends along a fold line.

7. The array substrate according to claim 5, wherein the groove extends along a curve.

8. The array substrate according to claim 1, wherein the bonding area surrounds two adjacent sides of the display area.

9. The array substrate according to claim 1, wherein the array substrate further comprises a driver integrated circuit chip disposed in the bonding area and bonded with the bonding area via a chip on film; a plurality of spaced second golden fingers arranged in parallel at intervals are disposed on one side of the chip on film away from the driver integrated circuit chip, wherein the second golden fingers are uniformly disposed on the chip on film, and the plurality of first golden fingers are electrically connected to the plurality of second golden fingers, respectively.

10. The array substrate according to claim 9, wherein a cross-sectional area of the first golden finger taken along a direction perpendicular to a thickness of the array substrate is greater than a cross-sectional area of the second golden finger taken along the direction perpendicular to the thickness of the array substrate.

11. The array substrate according to claim 9, wherein the first golden finger is adhered to the second golden finger via an anisotropic conductive film.

12. The array substrate according to claim 1, wherein the array substrate is a thin film transistor array substrate.

\* \* \* \* \*